(12) United States Patent
Ota

(10) Patent No.: US 12,062,341 B2
(45) Date of Patent: Aug. 13, 2024

(54) LIGHT-EMITTING DEVICE AND ELECTRONIC APPARATUS

(71) Applicant: SEIKO EPSON CORPORATION, Tokyo (JP)

(72) Inventor: Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 198 days.

(21) Appl. No.: 17/348,115

(22) Filed: Jun. 15, 2021

(65) Prior Publication Data

US 2021/0312872 A1  Oct. 7, 2021

Related U.S. Application Data

(63) Continuation of application No. 16/537,671, filed on Aug. 12, 2019, now Pat. No. 11,074,867.

(30) Foreign Application Priority Data

Aug. 13, 2018  (JP) ................... 2018-152212

(51) Int. Cl.
*G09G 3/3291* (2016.01)
*G09G 3/3258* (2016.01)
*H10K 59/131* (2023.01)

(52) U.S. Cl.
CPC ......... *G09G 3/3291* (2013.01); *G09G 3/3258* (2013.01); *H10K 59/131* (2023.02); *G09G 2310/0251* (2013.01)

(58) Field of Classification Search
CPC ............... G09G 3/3291; G09G 3/3258; G09G 2310/0251; G09G 2300/0842; G09G 2300/0861; G09G 3/3233; G09G 3/3208; G09G 3/3275; H10K 59/131
See application file for complete search history.

(56) References Cited

U.S. PATENT DOCUMENTS

| 2008/0111809 | A1 | 5/2008 | Lo et al. |
| 2008/0309653 | A1 | 12/2008 | Takahashi et al. |
| 2009/0273547 | A1 | 11/2009 | Tanikame et al. |
| 2012/0138940 | A1* | 6/2012 | Sato .................... H01L 27/1255 257/66 |

(Continued)

FOREIGN PATENT DOCUMENTS

| JP | 2010-049283 A | 3/2010 |
| JP | 2012-119532 A | 6/2012 |

(Continued)

*Primary Examiner* — Temesghen Ghebretinsae
*Assistant Examiner* — Sosina Abebe
(74) *Attorney, Agent, or Firm* — Oliff PLC

(57) ABSTRACT

A light-emitting device includes a data signal supply circuit, a first switching element including a first end electrically coupled to the data signal supply circuit, and a second end, a first capacitor electrically coupled to the second end of the first switching element and configured to hold an electric charge according to a gradation voltage, a second switching element including a first end electrically coupled to the second end of the first switching element, and a second end, a pixel circuit including a light-emitting element and a transistor, and a data line electrically coupled to the pixel circuit. The first capacitor is disposed to overlap the transistor in plan view.

15 Claims, 13 Drawing Sheets

(56) References Cited

U.S. PATENT DOCUMENTS

| | | | |
|---|---|---|---|
| 2013/0207564 A1* | 8/2013 | Ota | G09G 3/3241 |
| | | | 315/224 |
| 2014/0217432 A1* | 8/2014 | Ota | H10K 59/122 |
| | | | 257/89 |
| 2016/0042681 A1* | 2/2016 | Tamura | G09G 3/2092 |
| | | | 345/48 |
| 2016/0042692 A1* | 2/2016 | Ota | G09G 3/3233 |
| | | | 345/215 |
| 2016/0300864 A1 | 10/2016 | Seo et al. | |
| 2016/0322450 A1* | 11/2016 | Lee | G09G 3/3233 |
| 2016/0351600 A1* | 12/2016 | Moriwaki | H04N 9/3105 |
| 2018/0204884 A1* | 7/2018 | Isa | H10K 59/40 |

FOREIGN PATENT DOCUMENTS

| | | |
|---|---|---|
| JP | 2016-038425 A | 3/2016 |
| JP | 2017-083800 A | 5/2017 |

\* cited by examiner

LIGHT-EMITTING DEVICE AND ELECTRONIC APPARATUS

CROSS REFERENCE TO RELATED APPLICATION

This application is a continuation of U.S. Application Ser. No. 16/537,671, filed Aug. 12, 2019, the contents of which are incorporated herein by reference.

The present application is based on, and claims priority from JP Application Serial Number 2018-152212, filed on Aug. 13, 2018, the disclosure of which is hereby incorporated by reference herein in its entirety.

BACKGROUND

1. Technical Field

The present disclosure relates to a light-emitting device and an electronic apparatus.

2. Related Art

In recent years, various types of light-emitting devices using light-emitting elements such as organic light emitting diodes have been proposed. Hereinafter, an organic light emitting diode is referred to as an OLED (Organic Light Emitting Diode). In a light-emitting device of the related art, a pixel circuit including a light-emitting element and a drive transistor is provided corresponding to an intersection between a scanning line and a data line. JP-A-2016-38425 discloses a drive circuit suitable for driving a micro-sized pixel circuit.

In the technology disclosed in JP-A-2016-38425, a holding capacitor configured to hold a gradation voltage to be output to a data line is provided in the drive circuit. Accordingly, the holding capacitor is disposed in a portion other than a display region, where the pixel circuit is disposed, in the light-emitting device.

However, in the technology disclosed in JP-A-2016-38425, since the holding capacitor is provided in the portion other than the display region, there has been an issue such as enlargement of the portion other than the display region.

SUMMARY

In order to solve the above-described problem, one aspect of a light-emitting device according to the present disclosure includes a data signal supply circuit, a first switching element including a first end electrically coupled to the data signal supply circuit, and a second end, a first capacitor electrically coupled to the second end of the first switching element and configured to hold an electric charge according to a gradation voltage, a second switching element including a first end electrically coupled to the second end of the first switching element, and a second end, a pixel circuit including a light-emitting element and a transistor, and a data line electrically coupled to the pixel circuit. The transistor supplies a current to the light-emitting element according to the gradation voltage supplied via the data line, and the first capacitor is disposed to overlap the transistor in plan view.

Further, in order to solve the above-described problem, one aspect of a light-emitting device according to the present disclosure includes a data signal supply circuit, a first switching element including a first end electrically coupled to the data signal supply circuit, and a second end, a first capacitor electrically coupled to the second end of the first switching element, a second switching element including a first end electrically coupled to the second end of the first switching element, and a second end, a second capacitor including a first end electrically coupled to the second end of the second switching element, and a second end, a pixel circuit including a light-emitting element and a transistor, and a data line electrically coupled to the second end of the second capacitor and the pixel circuit. The first capacitor is disposed to overlap the transistor in plan view.

Further, in order to solve the above-described problem, one aspect of a light-emitting device according to the present disclosure includes a data signal supply circuit, a first switching element including a first end electrically coupled to the data signal supply circuit, and a second end, a first capacitor electrically coupled to the second end of the first switching element, a second switching element including a first end electrically coupled to the second end of the first switching element, and a second end, a pixel circuit including a light-emitting element and a transistor, and a data line electrically coupled to the second end of the second switching element and the pixel circuit. The first capacitor is disposed to overlap the transistor in plan view.

DESCRIPTION OF EXEMPLARY EMBODIMENTS

Hereinafter, modes for carrying out the present disclosure will be described with reference to accompanying drawings. However, in each figure, a size and a scale of each unit is different from the actual size and the actual scale of each unit as appropriate. Moreover, exemplary embodiments described below are suitable specific examples of the present disclosure, and various technically preferable limitations are applied, but the scope of the present disclosure is not limited to these modes unless it is specifically described in the following description to limit the present disclosure.

A. Exemplary Embodiment

Figure 1:
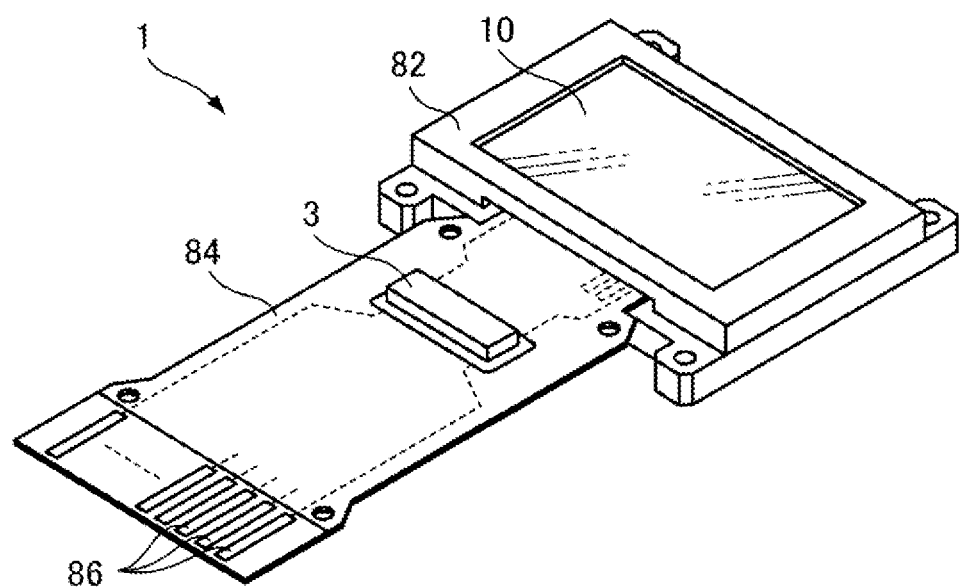
FIG. 1 is a perspective view illustrating a configuration of a light-emitting device 1 according to an exemplary embodiment of the present disclosure.

FIG. 1 is a perspective view illustrating a configuration of a light-emitting device 1 according to an exemplary embodiment of the present disclosure. The light-emitting device 1 serves as a micro display configured to display an image in a head-mounted display, for example.

As illustrated in FIG. 1, the light-emitting device 1 includes a display panel 10 and a control circuit 3 configured to control an operation of the display panel 10. The display panel 10 includes a plurality of pixel circuits, and a drive circuit configured to drive the pixel circuits. In the exemplary embodiment, the plurality of pixel circuits and the drive circuit provided in the display panel 10 are formed in a silicon substrate, and an OLED being an example of an electro-optical element is used in each of the pixel circuits. Moreover, for example, the display panel 10 is housed in a frame-shaped case 82 opened at a display unit, and is coupled with one end of a Flexible Printed Circuits (FPC) substrate 84. A control circuit 3 of a semiconductor chip is mounted on the FPC substrate 84 by a Chip On Film (COF) method, and a plurality of terminals 86 are provided to be coupled to an upper circuit (not illustrated).

Figure 2:
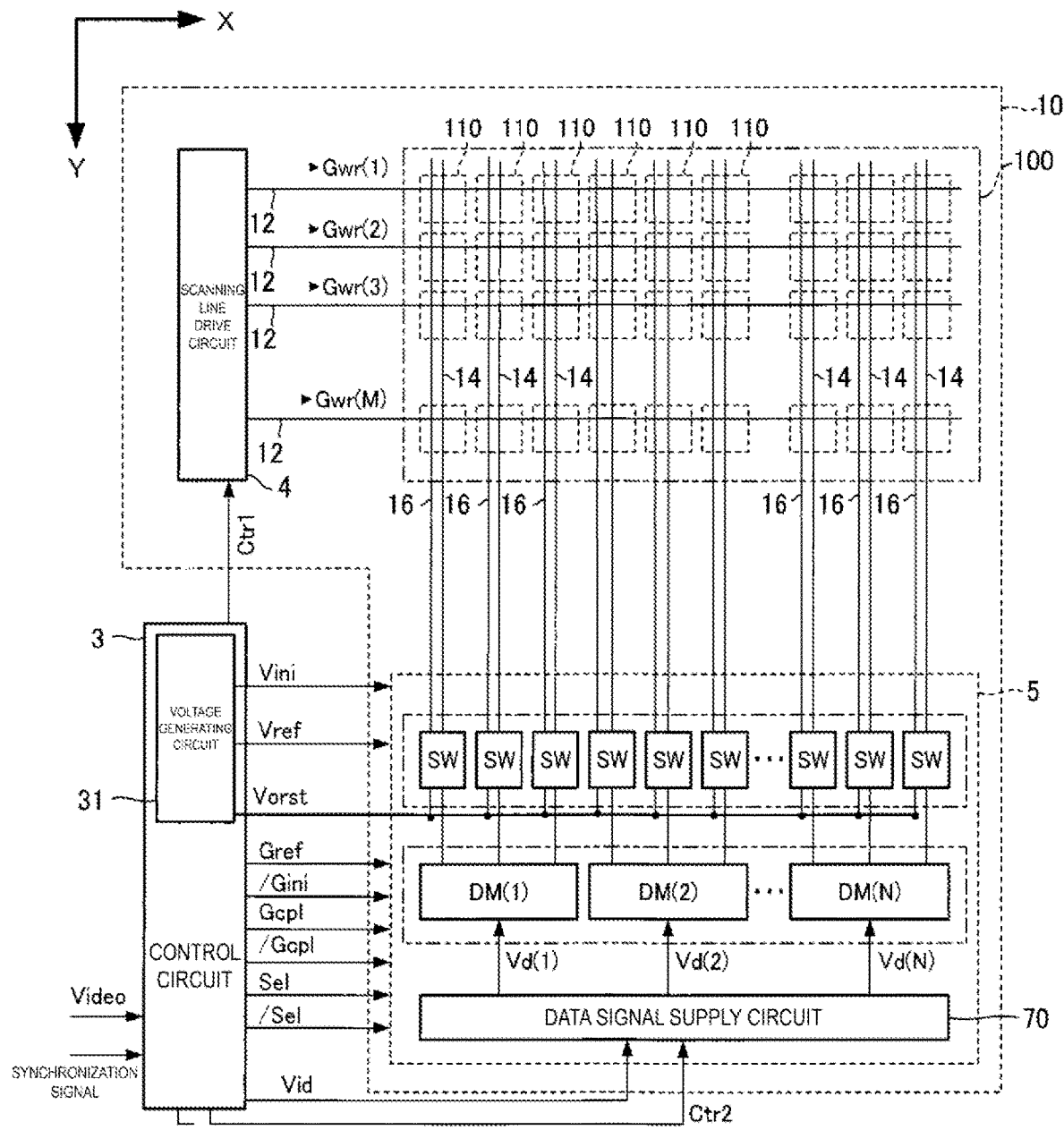
FIG. 2 is a diagram illustrating an electrical configuration of the light-emitting device 1.

FIG. 2 is a block diagram illustrating a configuration of the light-emitting device 1 according to the exemplary embodiment. As described above, the light-emitting device 1 includes the display panel 10 and the control circuit 3. To the control circuit 3, an image data Video, which is digital, is supplied from the upper circuit (not illustrated) synchronously with a synchronization signal. Here, the image data Video means data defining a display gradation of a pixel of an image to be displayed on the display panel 10, precisely, a display unit 100 described below by, for example, 8 bits. Moreover, the synchronization signal means a signal including a vertical synchronization signal, a horizontal synchronization signal, and a dot clock signal.

The control circuit 3 generates various control signals, based on the synchronization signal, and supplies the control signals to the display panel 10. Specifically, the control circuit 3 supplies control signals Ctrl, Ctr2, Gref, /Gini, Gcpl, /Gcpl, Sel(1), Sel(2), Sel(3), /Sel(1), /Sel(2), and /Sel(3) to the display panel 10. Each of the control signals Ctrl and Ctr2 is a signal including a plurality of signals such as a pulse signal, a clock signal, and an enable signal. The control signal Gref is a control signal having positive logic, and the control signal /Gini is a control signal having negative logic. The control signal Gcpl is also a control signal having positive logic, and the control signal /Gcpl is a control signal having negative logic having a relationship of logic inversion with the control signal Gcpl. The control signal /Sel(1) has a relationship of logic inversion with the control signal Sel(1). Similarly, the control signal /Sel(2) has a relationship of logic inversion with the control signal Sel(2), and the control signal /Sel(3) has a relationship of logic inversion with the control signal Sel(3), respectively. Note that the control signals Sel(1), Sel(2), and Sel(3) are generally referred to as a control signal Sel, and the control signals /Sel(1), /Sel(2), and /Sel(3) are generally referred to as a control signal /Sel. A voltage generating circuit 31 receives supply of power from a power supply circuit (not illustrated), and supplies a reset potential Vorst, a reference potential Vref, an initialization potential Vini, and the like to the display panel 10. Hereinafter, a configuration including the reference potential Vref, the control signal Gref, a transistor 43, a feed line 62, the initialization potential Vini, the control signal /Gini, a transistor 45, and a feed line 61 will be described below, but these may be omitted.

Further, the control circuit 3 generates an analog image signal Vid, based on the image data Video. Specifically, a lookup table associating a potential indicated by the image signal Vid and brightness of the electro-optical element provided in the display panel 10 is stored in the control circuit 3. Then, the control circuit 3 generates the image signal Vid indicating the potential corresponding to the brightness of the electro-optical element defined by the image data Video with reference to the lookup table, and supplies the image signal Vid to the display panel 10.

As illustrated in FIG. 2, the display panel 10 includes the display unit 100 and a drive circuit configured to drive the display unit 100. In the exemplary embodiment, the drive circuit is divided into a scanning line drive circuit 4 and a data line drive circuit 5, but these circuits may be integrated into a single circuit to constitute the drive circuit. As illustrated in FIG. 2, the display unit 100 includes pixel circuits 110 arranged in a matrix pattern, and corresponding to pixels of an image to be displayed. Although a detailed illustration is omitted in FIG. 2, the display unit 100 is provided with M rows of scanning lines 12 extending in a horizontal direction (X direction) in the figure, and is also provided with (3N) columns of data lines 14 grouped into each set of three columns and extending in a vertical direction (Y direction) in the figure. Each of the scanning lines 12 and each of the data lines 14 are provided to maintain mutual electrical insulation. The pixel circuits 110 are provided corresponding to intersections between the M rows of scanning lines 12 and the (3N) columns of data lines 14. Thus, in the exemplary embodiment, the pixel circuits 110 are arranged in a matrix pattern including M rows vertically and (3N) columns horizontally.

Here, each of M and N is a natural number. In the matrix of the scanning lines 12 and the pixel circuits 110, in order to distinguish the rows from each other, the rows may be referred as row 1, 2, 3, . . . , (M−1), and M in order from the top in the figure. Similarly, to distinguish the columns from each other in the matrix of the data lines 14 and the pixel circuits 110, the columns may be referred as column 1, 2, 3, . . . , (3N−1), and (3N) in order from the left in the figure. Here, to generalize and describe a group of the data lines 14, when n represents any integer of 1 or greater, the data lines 14 of columns (3n−2), (3n−1), and (3n) belong to a group n, as counting from the left. The three pixel circuits 110 corresponding to the scanning line 12 of the same row and three columns of the data lines 14 belonging to the same group respectively correspond to R, G, and B pixels, and these three pixels represent one dot of a color image to be displayed. That is, in the exemplary embodiment, a color of one dot is represented with an additive color mixture by light emission of the OLED corresponding to RGB.

Moreover, as illustrated in FIG. 2, the display unit 100 is provided with (3N) columns of feed lines 16 extending along the data lines 14. Each of the (3N) columns of feed lines 16 is provided to extend in the vertical direction, and to maintain mutual electrical insulation with each of the scanning lines 12. Each of the feed lines 16 is a fixed potential line supplied with a predetermined reset potential Vorst in common from the voltage generating circuit 31. To distinguish the columns of the feed lines 16 from each other, the columns are referred to as the feed lines 16 of columns 1, 2, 3, . . . , and (3N) sequentially from the left in the figure.

Each of the feed lines 16 of columns 1 to (3N) is provided corresponding to each of the data lines 14 of columns 1 to (3N).

The scanning line drive circuit 4 generates scanning signals Gwr for selecting M rows of the scanning lines 12 in a single frame period sequentially row by row, in accordance with the control signal Ctr1. In FIG. 2, the scanning signals Gwr supplied to the scanning lines 12 of rows 1, 2, 3, . . . , and M are respectively denoted by Gwr(1), Gwr(2), Gwr(3), . . . , Gwr(M-1), and Gwr(M). Note that the scanning line drive circuit 4 generates, in addition to the scanning signals Gwr(1) to Gwr(M), various types of control signals synchronized with the scanning signals Gwr for each row, and supplies the control signals to the display unit 100, however, such an illustration is omitted in FIG. 2. The frame period refers to a period necessary for the light-emitting device 1 to display one cut of an image. For example, when the frequency of the vertical synchronization signal included in the synchronization signal is 120 Hz, the period is 8.3 milliseconds of one cycle.

As illustrated in FIG. 2, the data line drive circuit 5 includes (3N) switch units SW corresponding to (3N) columns of the data lines 14, respectively in a one-to-one relationship, N demultiplexers DM each provided to each of three columns of the data lines 14 constituting each group, and a data signal supply circuit 70.

The data signal supply circuit 70 generates data signals Vd(1), Vd(2), . . . , and Vd(N), based on the image signal Vid and the control signal Ctr2 supplied from the control circuit 3. That is, the data signal supply circuit 70 generates the data signals Vd(1), Vd(2), . . . , and Vd(N), based on the image signal Vid obtained by time division multiplexing the data signals Vd(1), Vd(2), . . . , and Vd(N). Then, the data signal supply circuit 70 supplies the data signals Vd(1), Vd(2), . . . , and Vd(N) to the demultiplexers DM corresponding to groups 1, 2, . . . , and N, respectively.

A configuration of the pixel circuit 110, the switch unit SW, and the demultiplexer DM will now be described with reference to FIG. 3. To generally indicate the rows in which the pixel circuits 110 are arranged, m represents any integer of 1 or greater and M or less. Since the pixel circuits 110 are the same as one another in terms of an electrical configuration, here, the pixel circuit 110 of row m, and column (3n) positioned at row m and positioned at column (3n) will be described as an example. The pixel circuit 110 of row m is supplied with the scanning signal Gwr(m) and the control signals Gcmp(m) and Gel(m) from the scanning line drive circuit 4.

Figure 3:
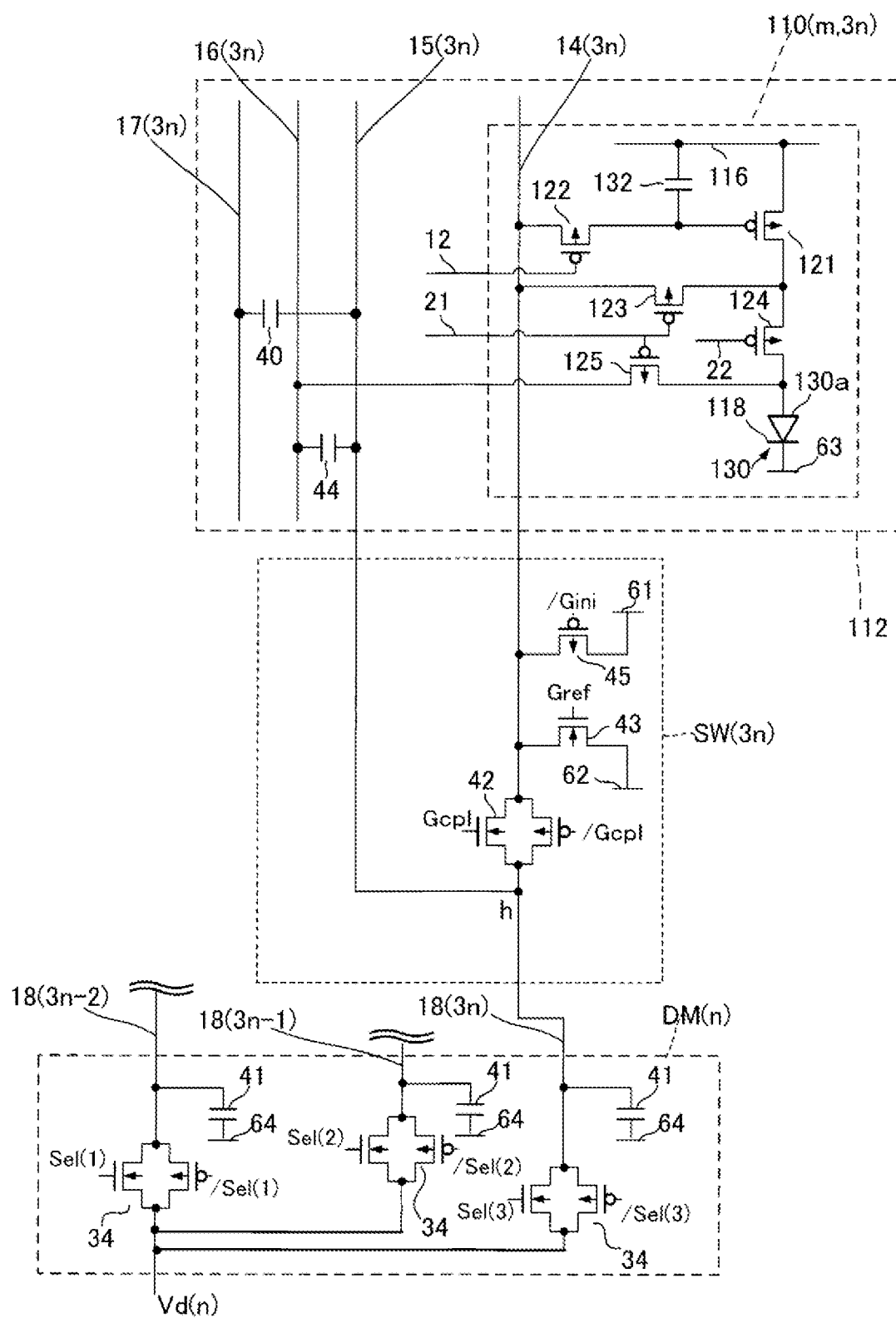
FIG. 3 is a diagram illustrating a configuration example of a pixel circuit 110, a switch unit SW, and a demultiplexer DM.

As illustrated in FIG. 3, a display region 112 of the display unit 100 is a region for displaying an image. The display region 112 is provided with the pixel circuit 110, and the data line 14 configured to supply a gradation voltage to the pixel circuit 110. In addition, the display region 112 is provided with the feed lines 16 and 17 and first wiring 15 for each column along the data line 14. In FIG. 3, the pixel circuit 110 of row m and column (3n) is denoted by "110(m, 3n)", and the data line 14 of column (3n) is denoted by "14(3n)". In FIG. 3, as with the data line 14, the first wiring 15 of column (3n) is denoted by "15(3n)", the feed line 16 of column (3n) is denoted by "16(3n)", and the feed line 17 of column (3n) is denoted by "17(3n)". As illustrated in FIG. 3, both the data line 14(3n) and the first wiring 15(3n) are coupled to the switch unit SW, and the pixel circuit 110 is coupled to the data line 14(3n). Note that, in FIG. 3, the switch unit SW coupled to the data line 14(3n) is denoted by "SW(3n)", and the demultiplexer DM coupled to the switch unit SW(3n) is denoted by "DM(n)". The pixel circuit 110(m, 3n) includes a first transistor 121, a second transistor 122, a third transistor 123, a fourth transistor 124, and a fifth transistor 125 each being a P-channel MOS-type transistor, an OLED 130, and a pixel capacitor 132. In the following, the first transistor 121, the second transistor 122, the third transistor 123, the fourth transistor 124, and the fifth transistor 125 may generally be referred to as the "transistors 121 to 125".

A gate of the second transistor 122 is electrically coupled to the scanning line 12 (the scanning line 12 of row m in the case of the pixel circuit 110(m, 3n)). Moreover, one of a source and a drain of the second transistor 122 is electrically coupled to the data line 14(3n), and the other is electrically coupled to a gate of the first transistor 121 and one of the electrodes of the pixel capacitor 132. The second transistor 122 functions as a switching transistor configured to control electrical coupling between the gate of the first transistor 121 and the data line 14(3n).

A source of the first transistor 121 is electrically coupled to a feed line 116. A potential Vel being the high-order side of the power source in the pixel circuit 110 is supplied to the feed line 116 from a power supply circuit (not illustrated). The first transistor 121 functions as a drive transistor in which a current corresponding to the voltage between the gate and source flows to the OLED 130.

One of a source and a drain of the third transistor 123 is electrically coupled to the data line 14(3n), and the other is electrically coupled to a drain of the first transistor 121. The control signal Gcmp(m) is provided to a gate of the third transistor 123. The third transistor 123 is a transistor configured to conduct electric current, via the data line 14(3n) and the second transistor 122, between the gate and the drain of the first transistor 121. That is, the third transistor 123 functions as a switching transistor configured to control electrical coupling between the gate and the drain of the first transistor 121.

A source of the fourth transistor 124 is electrically coupled to the drain of the first transistor 121, and a drain of the fourth transistor 124 is electrically coupled to an anode of the OLED 130. The control signal Gel(m) is provided to a gate of the fourth transistor 124. The fourth transistor 124 functions as a switching transistor configured to control electrical coupling between the drain of the first transistor 121 and the anode of the OLED 130.

One of a source and a drain of the fifth transistor 125 is electrically coupled to the feed line 16(3n), that is, to a fixed potential line configured to supply the reset potential Vorst, and the other is coupled to the anode of the OLED 130. The control signal Gcmp(m) is supplied to a gate of the fifth transistor 125. The fifth transistor 125 functions as a switching transistor configured to control electrical coupling between the feed line 16(3n) and the anode of the OLED 130.

In the exemplary embodiment, since the display panel 10 is formed on a silicon substrate, a substrate potential of each of the transistors 121 to 125 is assumed to be the potential Vel. Moreover, the sources and the drains of the transistors 121 to 125 as described above may be reversed in accordance with the channel types and potential relationships of the transistors 121 to 125. Moreover, each of the transistors may be a thin film transistor or may be a field effect transistor.

In the pixel capacitor 132, one electrode is electrically coupled to the gate of the first transistor 121, and the other electrode is electrically coupled to the feed line 116. Thus, the pixel capacitor 132 functions as a storage capacitor configured to hold the voltage between the gate and the source of the first transistor 121. Note that, as the pixel capacitor 132, a capacitor parasitic on the gate of the first transistor 121 may be used, and a capacitor formed by sandwiching an insulating layer between mutually different conductive layers in a silicon substrate may be used.

An anode 130a of the OLED 130 is a pixel electrode provided individually for each pixel circuit 110. In contrast, a cathode of the OLED 130 is a common electrode 118 commonly provided across all of the pixel circuits 110, and is coupled to a feed line 63. A potential Vct being a fixed potential is supplied to the feed line 63. Here, the potential Vct may be equivalent to an L level of each of the scanning signal and the control signal being logic signals. The OLED 130 is an element including a white organic electroluminescent (EL) layer sandwiched between the anode 130a of the OLED 130 and the cathode having optical transparency of the OLED 130 in the above-described silicon substrate. Then, a color filter corresponding to any of RGB is superimposed on an emission side of the OLED 130. In this example, the emission side of the OLED 130 is a cathode side of the OLED. Note that an optical distance between the two reflection layers disposed to sandwich the white organic EL layer may be adjusted to form a cavity structure, and a wavelength of light emitted from the OLED 130 may be set. In this case, a color filter may or may not be provided.

When a current flows from the anode 130a to the common electrode 118 being the cathode of the OLED 130, holes injected from the anode 130a and electrons injected from the cathode are recombined in the organic EL layer to produce excitons, and white light is generated. The white light generated at this time passes through the cathode on the side opposite to the silicon substrate, and the white light is colored by using a color filter, and is visually recognized on the observer side.

As illustrated in FIG. 3, the demultiplexer DM(n) is an assembly of a transmission gate 34 and a capacitor 41 provided for each column, and sequentially supplies data signals to the three columns constituting each group. Input ends of the transmission gates 34 corresponding to columns (3n−2), (3n−1), and 3 (n) belonging to group n are mutually coupled in common and the data signal Vd(n) is supplied to each of the common terminals. An output end of the transmission gate 34 corresponding to column (3n) is coupled to an input end of the switch unit SW(3n) via a signal line 18(3n). While a detailed illustration is omitted in FIG. 3, an output end of the transmission gate 34 corresponding to column (3n−1) is coupled to an input end of the switch unit SW(3n−1) via a signal line 18(3n−1), and an output end of the transmission gate 34 corresponding to column (3n−2) is coupled to an input end of the switch unit SW(3n−2) via a signal line 18(3n−2).

One electrode of the capacitor 41 corresponding to column (3n) is coupled to the signal line 18(3n), and the other electrode of the capacitor 41 corresponding to column (3n) is coupled to a feed line 64. Similarly, one electrode of the capacitor 41 corresponding to column (3n−1) is coupled to the signal line 18(3n−1), and one electrode of the capacitor 41 corresponding to column (3n−2) is coupled to the signal line 18(3n−2). The other electrode of the capacitor 41 corresponding to column (3n−1) and the other electrode of the capacitor 41 corresponding to column (3n−2) are coupled to the feed line 64. A potential VSS being a fixed potential is supplied to the feed line 64. Here, the potential VSS may be equivalent to the L level of each of the scanning signal and the control signal being logic signals.

The transmission gate 34 provided in column (3n−2) being a left end column in group n is turned on (conducts electricity) when the control signal Sel(1) is at an H level (when the control signal /Sel(1) is at the L level). Similarly, the transmission gate 34 provided in column (3n−1) being a center column in group n is turned on when the control signal Sel(2) is at the H level (when the control signal /Sel(2) is at the L level), and the transmission gate 34 provided in column (3n) being a right end column in group n is turned on when the control signal Sel(3) is at the H level, that is, when the control signal /Sel(3) is at the L level.

The switch unit SW(3n) includes a transmission gate 42, an N-channel MOS type transistor 43, and a P-channel MOS type transistor 45. In the switch unit SW(3n), an input end of the transmission gate 42 serves as an input end of the switch unit SW(3n). The signal line 18(3n) is coupled to the input end of the transmission gate 42 of the switch unit SW(3n). The first wiring 15(3n) is coupled to a node h in the signal line 18(3n). Accordingly, in the demultiplexer DM(n), one of the electrodes of the capacitor 41 corresponding to column 3n is coupled to the first wiring 15(3n) via the signal line 18(3n). The data line 14(3n) is coupled to an output end of the transmission gate 42. The control signal Gcpl and the control signal /Gcpl are supplied from the control circuit 3 to the transmission gate 42. The transmission gate 42 is turned on when the control signal Gcpl is at the H level, that is, when the control signal /Gcpl is at the L level. When the transmission gate 42 is turned on, the first wiring 15(3n) coupled to the signal line 18(3n) is electrically coupled to the data line 14(3n) in the signal line 18(3n) and the node h.

A drain of the transistor 45 is coupled to the data line 14(3n), and a source of the transistor 45 is coupled to the feed line 61 to which a predetermined initialization potential Vini is supplied. The control circuit 3 supplies the control signal /Gini to a gate of the transistor 45. In the transistor 45, the data line 14(3n) and the feed line 61 are electrically coupled to each other when the control signal /Gini is at the L level, and are electrically uncoupled when the control signal /Gini is at the H level. When the data line 14(3n) is electrically coupled to the feed line 61, a potential of the data line 14(3n) becomes the initialization potential Vini.

A drain of the transistor 43 is coupled to the data line 14(3n), and a source of the transistor 43 is coupled to the feed line 62 to which the reference potential Vref is supplied. The reference potential Vref is a reference potential used in a compensation operation of compensating a threshold voltage of the drive transistor, that is, the first transistor 121 of the pixel circuit 110. The control signal Gref is supplied to a gate of the transistor 43. In the transistor 43, the data line 14(3n) and the feed line 62 are electrically coupled to each other when the control signal Gref is at the H level, and are electrically uncoupled when the control signal Gref is at the L level. When the data line 14(3n) is electrically coupled to the feed line 62, a potential of the data line 14(3n) becomes the reference potential Vref.

A capacitor 44 in FIG. 3 is an inter-wiring capacitor formed between the feed line 16 and the first wiring 15(3n). A capacitor 40 in FIG. 3 is an inter-wiring capacitor formed between the feed line 17 and the first wiring 15(3n). The feed line 17 is provided with the potential Vel. When the transmission gate 34 is turned on in a state where the transmission gate 42 is turned off, a data signal Vd(n) is supplied to the signal line 18(3n) from the output end of the transmission gate 34, and a charge commensurate with a gradation voltage indicated by the data signal Vd(n) is accumulated in the capacitors 40, 41, and 44. That is, the capacitors 40, 41, and 44 of column (3n) each serve as a holding capacitor configured to hold a gradation voltage commensurate with a display gradation of the pixel circuit 110 of column (3n). Then, when the transmission gate 42 is turned on in a state where the gradation voltage is held in the capacitors 40, 41, and 44, the signal line 18(3n) and the first wiring 15(3n) are electrically coupled to the data line 14, and the gradation voltage held in the capacitors 40, 41, and 44 is supplied to the pixel circuit 110(m, 3n) via the data line 14(3n).

In the exemplary embodiment, the capacitor 41 is provided together with the transmission gate 34, the transmission gate 42, and the transistors 43 and 45 in a portion other than the display region 112, that is, an outer frame region surrounding the display region 112 in the light-emitting device 1. On the other hand, the capacitors 40 and 44 are provided in the display region (that is, the display region 112). As described above, the capacitor 44 of column (3n) is an inter-wiring capacitor formed between the feed line 16(3n) and the first wiring 15(3n), and the feed line 16(3n) and the first wiring 15(3n) are provided side by side in the display region 112 to form the capacitor 44. Further, the capacitor 40 of column (3n) is an inter-wiring capacitor formed between the feed line 17 (3n) and the first wiring 15(3n), and the first wiring 15(3n) is provided with an electrode 40a that faces the feed line 17 (3n) in the display region 112 to form the capacitor 40. Further, in a case where the electrode 40a includes a portion facing the feed line 16(3n), the capacitor 44 in column (3n) is also formed between the electrode 40a and the feed line 16(3n).

Figure 4:
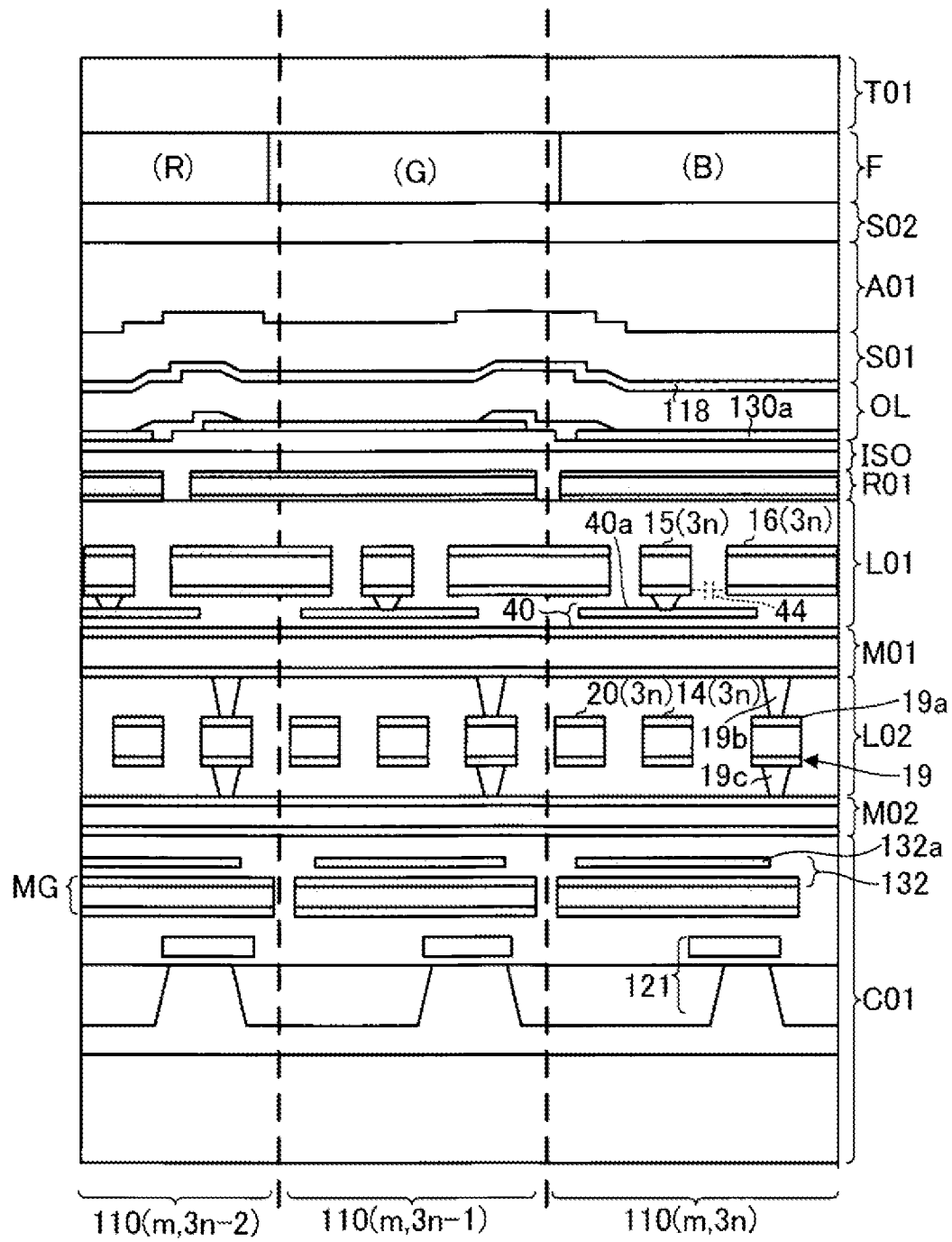
FIG. 4 is a partial cross-sectional view of a display panel 10.

FIG. 4 is a partial cross-sectional view illustrating a cross section of the display unit 100 in a plane passing through the pixel circuits 110(m, 3n-2), 110(m, 3n-1), and 110(m, 3n). As illustrated in FIG. 4, the display unit 100 includes a circuit layer C01, a second metal layer M02, a second wiring layer L02, a first metal layer M01, a first wiring layer L01, a reflective layer R01, an insulating layer ISO, a light-emitting element layer OL, a first sealing layer S01, a planarization layer A01, a second sealing layer S02, a color filter layer F, and a transparent substrate T01 layered one on another in this order.

The transparent substrate T01 is formed of glass or a transparent resin. The color filter layer F is provided with the above-described color filter. The first sealing layer S01 and the second sealing layer S02 are each formed of $SiO_n$ by a film formation method such as chemical vapor deposition (CVD), for example. The planarization layer A01 is formed of an epoxy resin by a film formation method such as printing and an ink-jet method, for example. In the light-emitting element layer OL, the OLED 130 described above is formed. FIG. 4 illustrates the common electrode 118 being the cathode and the anode 130a of the OLED 130. In the circuit layer C01, the transistors 121 to 125 and the pixel capacitor 132 included in the pixel circuit 110 are formed. In the example illustrated in FIG. 4, the pixel capacitor 132 and the transistor 121, more precisely, the gate of the transistor 121, are illustrated as an example of a circuit element formed in the circuit layer C01. Here, the circuit layer C01 includes a metal layer MG, and the pixel capacitor 132 includes an electrode 132a that forms a capacitor between the metal layer MG and the electrode 132a. The metal layer MG and the electrode 132a are each formed of a metal such as aluminum by a film formation method such as CVD, for example. Note that, in the circuit layer C01, an interlayer insulating film or a dielectric film formed of $SiO_2$, SiN, or the like is appropriately disposed between conductor layers such as the metal layer MG and the electrode 132a.

The second metal layer M02, the second wiring layer L02, the first metal layer M01, and the first wiring layer L01 are each formed of a metal such as aluminum by a film formation method such as CVD, for example. An interlayer insulating film or a dielectric film formed of $SiO_2$, SiN, or the like is appropriately disposed between these layers. As illustrated in FIG. 4, the first metal layer M01 is provided closer to the light-emitting element layer OL side than the circuit layer C01, and the first wiring layer L01 is provided closer to the light-emitting element layer OL side than the first metal layer M01. As illustrated in FIG. 4, the feed line 16(3n) and the first wiring 15(3n) are formed in the first wiring layer L01. Since the capacitor 44 of column (3n) is an inter-wiring capacitor formed between the feed line 16(3n) and the first wiring 15(3n) as described above, the capacitor 44 is formed in the first wiring layer L01.

The second metal layer M02 and the second wiring layer L02 are formed between the circuit layer C01 and the first metal layer M01, and the data line 14(3n) and second wiring 20 (3n) are formed in the second wiring layer L02. Moreover, the first metal layer M01 and the second metal layer M02 are coupled to each other via a plurality of wiring portions 19. The wiring portion 19 includes a relay metal layer 19a, a plurality of contact portions 19b, and a plurality of contact portions 19c. The plurality of contact portions 19b couple the first metal layer M01 to the relay metal layer 19a. The plurality of contact portions 19c couple the second metal layer M02 to the relay metal layer 19a. The relay metal layer 19a is formed in the same layer as the data line 14. In the exemplary embodiment, as illustrated in FIG. 4, the data line 14 is surrounded by the first metal layer M01, the second metal layer M02, and the plurality of wiring portions 19 at the fixed potential when viewed in cross section across the data line 14. Note that the second wiring 20 in the exemplary embodiment is dummy wiring, and may be, for example, supplied with a fixed potential or omitted.

Here, the first metal layer M01, the second metal layer M02, and the plurality of wiring portions 19 are supplied with a common fixed potential (the potential Vel in the exemplary embodiment) from the feed line 17, and the first metal layer M01, the second metal layer M02, and the plurality of wiring portions 19 serve as a shield configured to protect the data line 14(3n) from electrostatic noise. From a different perspective, the first metal layer M01, the second metal layer M02, and the plurality of wiring portions 19 function as the feed line 17. Further, the capacitor 40 of column (3n) is an inter-wiring capacitor between the feed line 17 (3n) and the first wiring 15(3n), and the capacitor 40 is formed between the electrode 40a coupled to the first wiring 15(3n) and the first metal layer M01.

As described above, the first wiring layer L01 in which the capacitors 40 and 44 are formed and the first metal layer M01 are overlaid on the second wiring layer L02 in which the data line 14 to which the pixel circuit 110 is coupled is formed, and thus the capacitors 40 and 44 forming a holding capacitor together with the capacitor 41 are formed in the display region 112. In the exemplary embodiment, since the capacitors 40, 41, and 44 each serve as a holding capacitor configured to hold the gradation voltage according to the display gradation of the pixel circuit 110, a size of the capacitor 41 can be reduced as compared to an aspect in which the capacitors 40 and 44 are not provided, and an area of the outer frame region of the display panel 10 can be reduced. Thus, according to the exemplary embodiment, a chip area of the portion other than the display region 112 in the light-emitting device 1 can be reduced.

In addition, the capacitor 40 overlaps the first transistor 121 in plan view. Thus, the capacitor 40 serves not only as the holding capacitor described above, but also serves as an electrostatic shield and light shielding for the first transistor 121.

Figure 5:
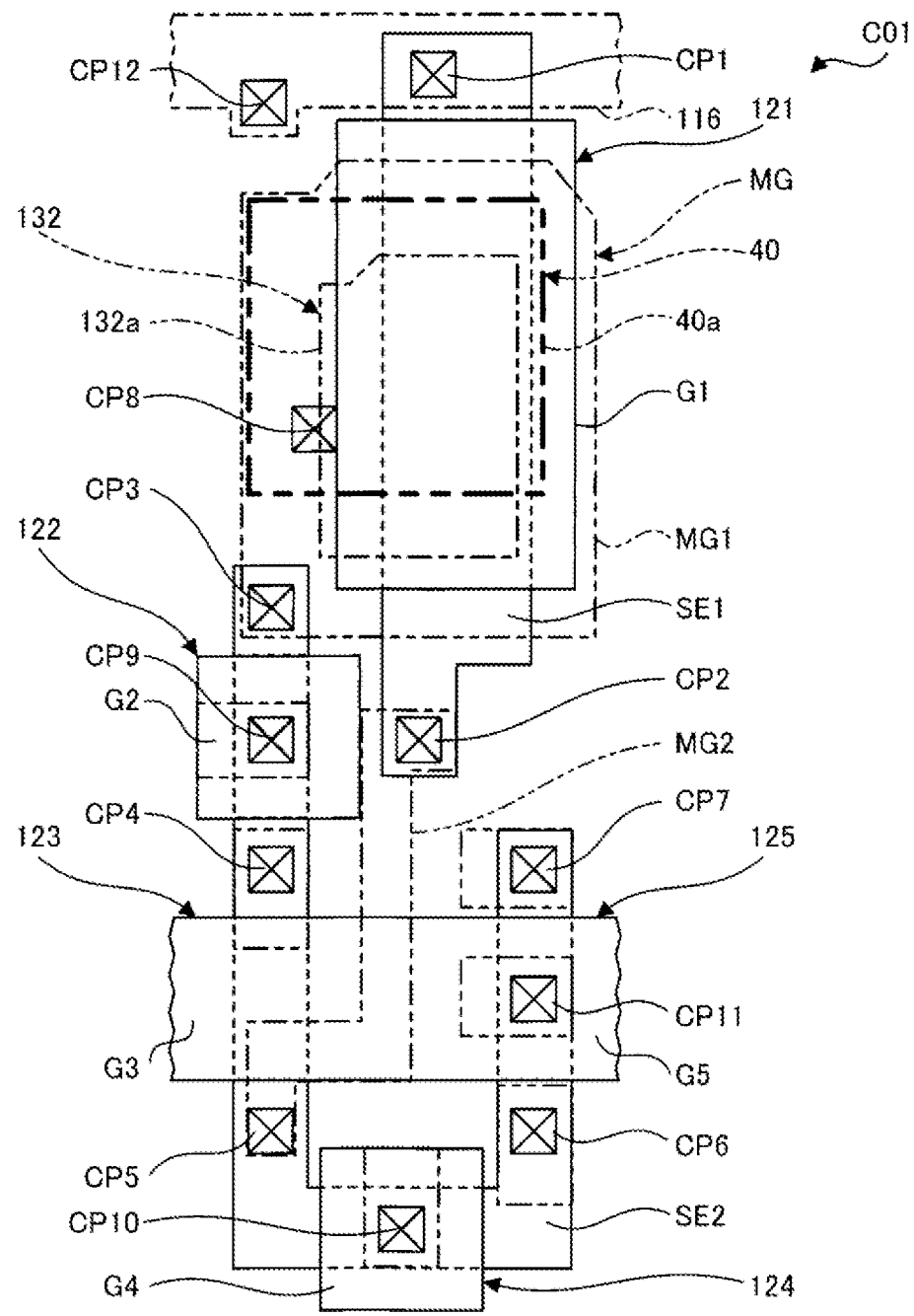
FIG. 5 is a plan view illustrating an arrangement of transistors 121 to 125 and a pixel capacitor 132.

FIG. 5 is a plan view illustrating an arrangement of the transistors 121 to 125 and the pixel capacitor 132. As illustrated in FIG. 5, the circuit layer C01 includes semiconductor layers SE1 and SE2, gate electrodes G1, G2, G3, G4, and G5, and contact portions CP1, CP2, CP3, CP4, CP5, CP6, and CP7.

The semiconductor layer SE1 is provided corresponding to the first transistor 121. The gate electrode G1 corresponding to the first transistor 121 is disposed on the semiconductor layer SE1 via a gate insulating film (not illustrated). Further, the contact portions CP1 and CP2 are coupled to the semiconductor layer SE1, and one of the contact portions CP1 and CP2 functions as a source electrode of the first transistor 121 and the other functions as a drain electrode of the first transistor 121. The contact portion CP1 is electrically coupled to the feed line 116, and the contact portion CP2 is electrically coupled to the third transistor 123 and the fourth transistor 124 via a portion MG2 described later and the contact portion CP5.

The semiconductor layer SE2 is provided commonly to the second transistor 122, the third transistor 123, the fourth transistor 124, and the fifth transistor 125. The gate electrodes G2, G3, G4, and G5 are disposed on the semiconductor layer SE2 via a gate insulating film (not illustrated). The gate electrodes G2, G3, G4, and G5 correspond to the second transistor 122, the third transistor 123, the fourth transistor 124, and the fifth transistor 125, respectively. In the illustration, the gate electrodes G3 and G5 are integrated. Further, the contact portions CP3, CP4, CP5, CP6, and CP7 are coupled to the semiconductor layer SE2. One of the contact portions CP3 and CP4 functions as a source electrode of the second transistor 122 and the other functions as a drain electrode of the second transistor 122. One of the contact portions CP4 and CP5 functions as a source electrode of the third transistor 123 and the other functions as a drain electrode of the third transistor 123. One of the contact portions CP5 and CP6 functions as a source electrode of the fourth transistor 124 and the other functions as a drain electrode of the fourth transistor 124. One of the contact portions CP6 and CP7 functions as a source electrode of the fifth transistor 125 and the other functions as a drain electrode of the fifth transistor 125. Therefore, one of the source electrode and the drain electrode of the second transistor 122 is provided commonly to one of the source electrode and the drain electrode of the third transistor 123, and this common portion is the contact portion CP4. Further, one of the source electrode and the drain electrode of the third transistor 123 is provided commonly to one of the source electrode and the drain electrode of the fourth transistor 124, and this common portion is the contact portion CP5. Further, one of the source electrode and the drain electrode of the fourth transistor 124 is provided commonly to one of the source electrode and the drain electrode of the fifth transistor 125, and this common portion is the contact portion CP6.

The contact portion CP3 is electrically coupled to the gate electrode G1 of the first transistor 121 via a portion MG1 described later and the contact portion CP8. The contact portion CP4 is electrically coupled to the data line 14. The contact portion CP5 is electrically coupled to the drain of the first transistor 121. The contact portion CP6 is electrically coupled to the anode of the OLED 130. The contact portion CP7 is electrically coupled to the feed line 16.

The gate electrode G2 is electrically coupled to the scanning line 12 via the contact portion CP9. The gate electrodes G3 and G5 are electrically coupled to a control line 21 via the contact portion CP11. The gate electrode G4 is electrically coupled to the control line 22 via the contact portion CP10. The feed line 116 is electrically coupled to a portion M02a described later via the contact portion CP12.

Further, the metal layer MG of the circuit layer C01 includes the portion MG1 that overlaps the first transistor 121 in plan view. The metal layer MG also includes the portion MG2 that electrically couples the contact portion CP2 to the contact portion CP5. The electrode 132a faces the portion MG1 to overlap the portion MG1 in plan view, and the pixel capacitor 132 described above is formed between the portion MG1 and the electrode 132a. As illustrated in FIG. 5, the capacitor 40, more specifically, the electrode 40a of the capacitor 40 overlaps the first transistor 121 in plan view. In addition, the capacitor 40, more specifically, the electrode 40a of the capacitor 40 overlaps the pixel capacitor 132, specifically, the electrode 132a in plan view.

Figure 6:
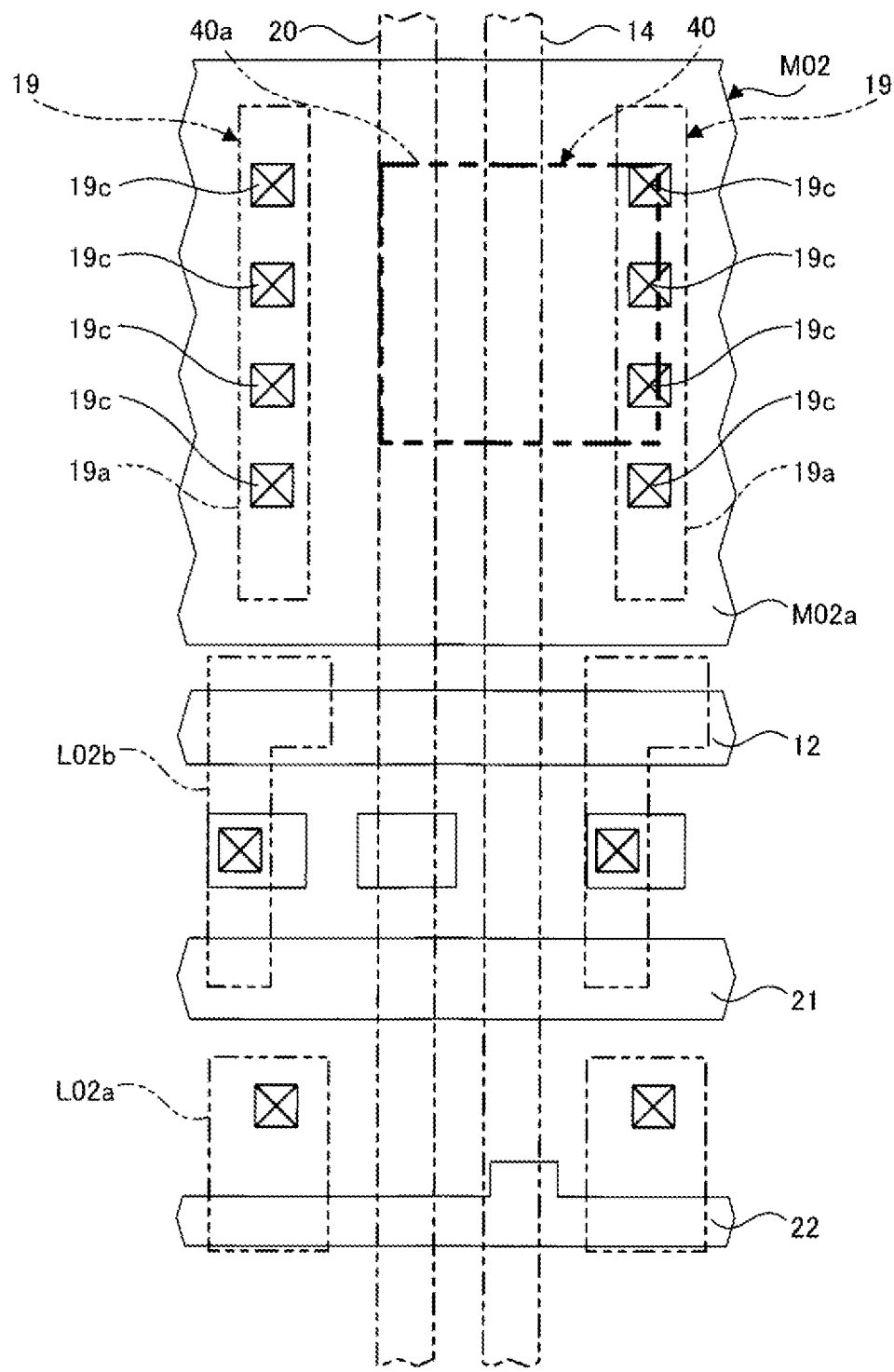
FIG. 6 is a plan view illustrating an arrangement of a second metal layer M02 and a second wiring layer L02.

FIG. 6 is a plan view illustrating an arrangement of the second metal layer M02 and the second wiring layer L02. As illustrated in FIG. 6, the second metal layer M02 includes the portion M02a that contains the capacitor 40 in plan view. Although it is not illustrated in the figure, the portion M02a forms a shape that overlaps the first transistor 121 inplan view. Further, the second wiring layer L02 is formed on the portion M02a. Specifically, a part of the data line 14 and a part of the second wiring 20 extend on the portion M02a, and the two wiring portions 19 are disposed to sandwich the data line 14 and the second wiring 20. As illustrated in FIG. 6, the plurality of contact portions 19c of each of the wiring portions 19 are aligned along the data line 14. Further, the scanning line 12 and the control lines 21 and 22 are formed in the second metal layer M02. Further, the second wiring layer L02 includes a portion L02a electrically coupled to the anode of the OLED 130 and a portion L02b electrically coupled to the feed line 16.

Figure 7:
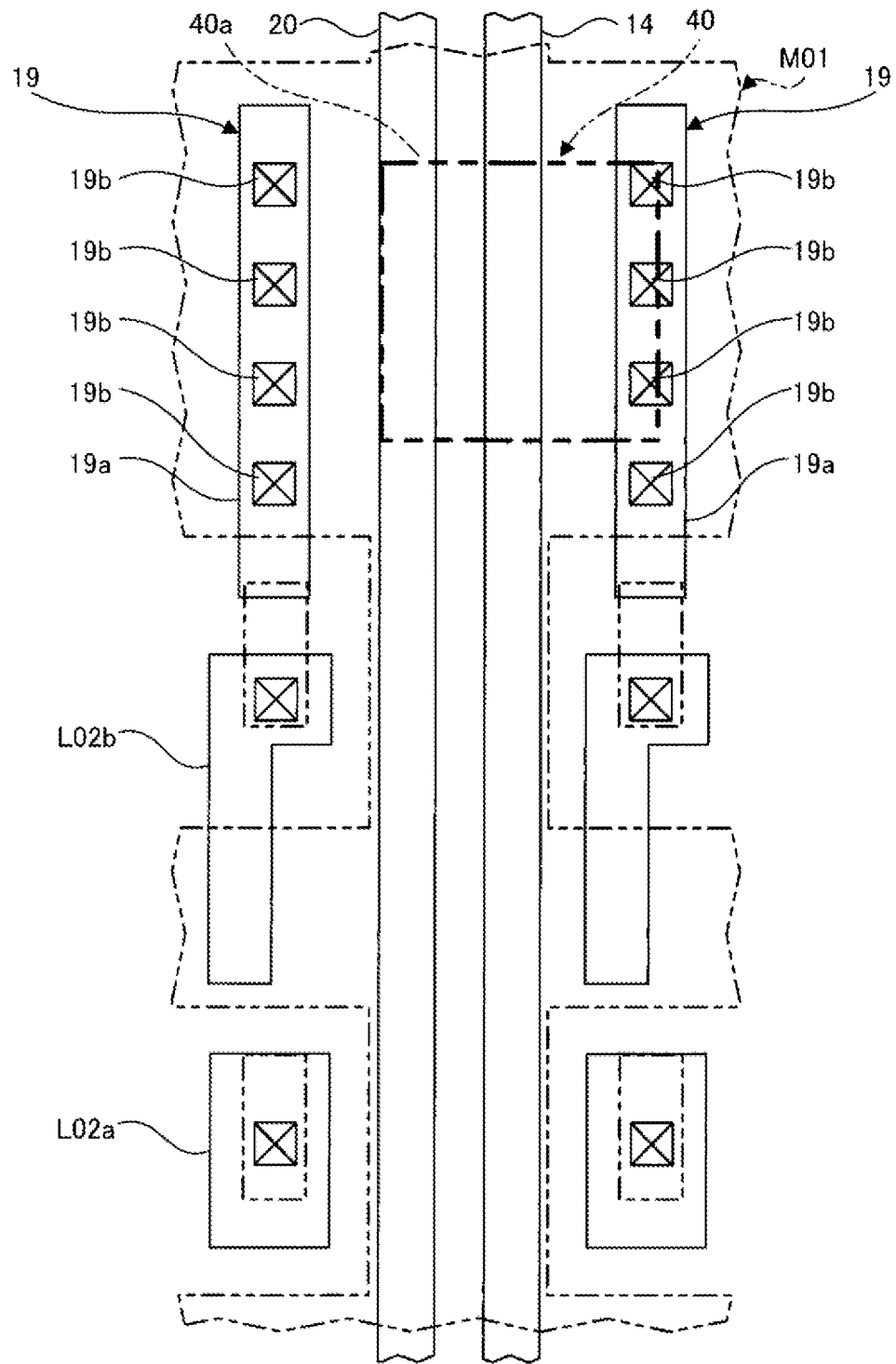
FIG. 7 is a plan view illustrating an arrangement of a first metal layer M01 and the second wiring layer L02.
Figure 8:
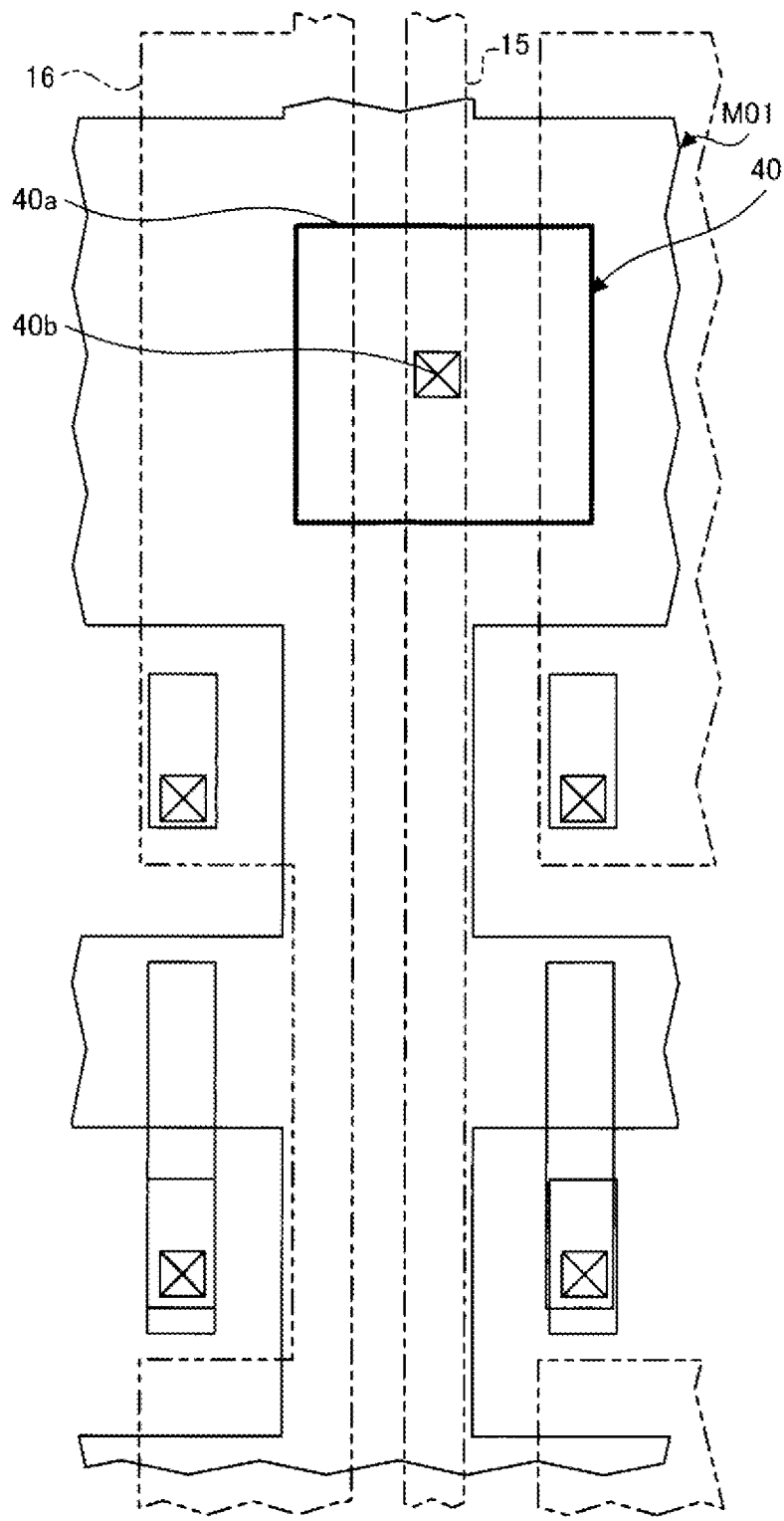
FIG. 8 is a plan view illustrating an arrangement of the first metal layer M01 and a first wiring layer L01.

FIG. 7 is a plan view illustrating an arrangement of the first metal layer M01 and the second wiring layer L02. FIG. 8 is a plan view illustrating an arrangement of the first metal layer M01 and the first wiring layer L01. As illustrated in FIG. 7, the relay metal layer 19a of each of the wiring portions 19 has a shape extending along the data line 14, and the plurality of contact portions 19b are aligned along the data line 14 on the relay metal layer 19a. As illustrated in FIGS. 7 and 8, the first metal layer M01 has a shape that contains the capacitor 40 in plan view. As illustrated in FIG. 8, the electrode 40a of the capacitor 40 includes a portion that overlaps the first wiring 15 in plan view. A contact portion 40b coupled to the first wiring 15 is provided on the portion of the electrode 40a. Although it is not illustrated in the figure, the first metal layer M01 overlaps the first transistor 121 in plan view.

As described above, the light-emitting device 1 above includes the pixel circuit 110 disposed in the display region 112, the data line 14 coupled to the pixel circuit 110, the data line drive circuit 5 configured to output the data signal Vd(N) to the data line 14, and the capacitor 40 being a first capacitor configured to hold the data signal Vd(N). Here, the pixel circuit 110 includes the light-emitting element 130, and the first transistor 121 being a transistor configured to supply a current based on the data signal Vd(N) according to a gradation to be displayed to the light-emitting element 130. The capacitor 40 is disposed in the display region 112 to overlap the first transistor 121 in plan view.

In this way, in the light-emitting device 1, the capacitor 40 that serves as a holding capacitor configured to hold the data signal Vd(N) is provided in the display region 112. Thus, in the light-emitting device 1, an area of a portion other than the display region 112 in the light-emitting device 1 can be reduced as compared to the related art in which a holding capacitor is provided only in a portion other than a display region.

In the light-emitting device 1, the capacitor 40 is disposed to overlap the first transistor 121, serving as a drive transistor configured to supply a current based on the data signal Vd(N) to the light-emitting element 130, in plan view. Thus, in the light-emitting device 1, the capacitor 40 also serves as an electrostatic shield and light shielding for the first transistor 121. In this way, since the capacitor 40 simultaneously plays a plurality of roles, layout efficiency of the pixel circuit 110 is increased as compared to a case where these functions are configured separately. As a result, fine pixels can be achieved.

As described above, the light-emitting device 1 further includes the circuit layer C01 in which the pixel circuit 110 is provided, the first wiring layer L01 in which the first wiring 15 disposed along the data line 14 is provided, and the first metal layer M01 disposed between the circuit layer C01 and the first wiring layer L01. Here, the potential Vel being a fixed potential is supplied to the first metal layer M01, and the first metal layer M01 includes a portion disposed between the data line 14 and the first wiring 15. Thus, the first metal layer M01 serves as an electrostatic shield between the data line 14 and the first wiring 15. As a result, the generation of crosstalk between the data line 14 and the first wiring 15 can be reduced, and the display quality can be improved.

As described above, the first metal layer M01 overlaps the first transistor 121 in plan view. Thus, the first metal layer M01 serves as light shielding for the first transistor 121. Here, since the first metal layer M01 is a layer different from the first wiring layer L01, there is an advantage that an area of the portion of the first metal layer M01 that serves as light shielding can be easily increased as compared to a case where the first metal layer M01 is the same layer as the first wiring layer L01.

As described above, the capacitor 40 is a capacitor between the electrode 40a coupled to the first wiring 15 and the first metal layer M01. In this way, since the capacitor 40 is provided between the first wiring 15 and the first metal layer M01, the capacitor 40 can serve as light shielding for the first transistor 121 by using light-shielding properties of the first metal layer M01. Here, the first metal layer M01 simultaneously serves as one of the pair of electrodes constituting the capacitor 40. As a result, in the light-emitting device 1, the layout efficiency of the pixel circuit 110 is increased as compared to a case where a holding capacitor is configured without using the first metal layer M01.

As described above, the light-emitting device 1 further includes the second metal layer M02 disposed between the circuit layer C01 and the first metal layer M01, and the second wiring layer L02 disposed between the first metal layer M01 and the second metal layer M02. Here, a fixed potential is supplied to the second metal layer M02. Then, the data line 14 is provided in the second wiring layer L02 disposed between the first metal layer M01 and the second metal layer M02. Thus, the data line 14 can be shielded electrostatically by the first metal layer and the second metal layer at the fixed potential.

The second metal layer M02 overlaps the first transistor 121 in plan view. Thus, the second metal layer M02 serves as light shielding for the first transistor 121. Here, since the second metal layer M02 is a layer different from the first wiring layer L01 and the data line 14, there is an advantage that an area of the portion of the second metal layer M02 that serves as light shielding can be easily increased as compared to a case where the second metal layer M02 is the same layer as the first wiring layer L01 or the data line 14.

As described above, the light-emitting device 1 further includes the plurality of wiring portions 19 configured to couple the first metal layer M01 to the second metal layer M02. Here, the data line 14 includes a portion disposed between a pair of wiring portions of the plurality of wiring portions 19. Thus, the data line 14 can be shielded electrostatically by the plurality of wiring portions 19 at the fixed potential.

As described above, the light-emitting device 1 further includes the feed line 16 being a fixed potential line disposed along the data line 14, and the capacitor 44 being a second capacitor configured to hold the data signal Vd(N). Here, the reset potential Vorst being a fixed potential is supplied to the feed line 16. Then, the capacitor 44 is a capacitor between the first wiring 15 and the feed line 16. In this way, not only the capacitor 40 but also the capacitor 44 serve as a holding capacitor configured to hold the data signal Vd(N). Thus, a holding capacitor in the display region 112 can be easily increased as compared to a case where the capacitor 44 between the first wiring 15 and the feed line 16 is not used. In addition, since the feed line 16 is disposed along the data line 14 in the same manner as the first wiring 15, the capacitor 44 is easily formed between the first wiring 15 and the feed line 16 as compared to a case where the first wiring 15 and the feed line 16 are disposed along different directions from each other.

Note that, in the exemplary embodiment, in addition to the capacitors 40 and 44, the capacitor 41 serves as a holding capacitor configured to hold the data signal Vd(N), and at least one of the capacitors 41 and 44 may be omitted. In this case, in particular, by omitting the capacitor 41 disposed outside the display region 112, an area of a portion other than the display region 112 in the light-emitting device 1 can be reduced.

Further, one of the capacitors 40 and 44 may be omitted, and the other may overlap a drive transistor in plan view. Further, the capacitor 44 may overlap the first transistor 121 in plan view, and, in this case, the capacitor 40 may overlap or may not overlap the first transistor 121 in plan view. The capacitor 44 is an inter-wiring capacitor between the feed line 16(3n) and the first wiring 15(3n), but at least a part of the feed line 16(3n) and the first wiring 15(3n) or a part (a portion formed by the capacitor) between the feed line 16(3n) and the first wiring 15(3n) may overlap the first transistor 121 in plan view. In the above description, a potential of the feed line 17 is the potential Vel, and a potential of the feed line 16 is the reset potential Vorst, but these potentials may be another fixed potential. However, from a perspective of simplifying the circuit, a potential supplied to one of the electrodes of the capacitors 40 and 44 is preferably a potential used in the pixel circuit 110.

As described above, the first wiring 15 and the feed line 16 are provided in the same layer, that is, in the first wiring layer L01. Thus, as compared to a case where the first wiring 15 and the feed line 16 are provided in different layers, the wiring can be efficiently disposed. Here, since both of the first wiring 15 and the feed line 16 are disposed along the data line 14, it is easy to provide these layers in the same layer.

As described above, the data line 14 is disposed between the first transistor 121 and the first wiring 15. Thus, a distance between the data line 14 and the first wiring 15 can be easily increased as compared to a case where the data line 14 and the first wiring 15 are provided in the same layer.

Further, a distance between the data line 14 and the pixel circuit 110 is shortened, and thus the wiring between the data line 14 and the pixel circuit 110 is simplified.

B. Modification Example

Although an exemplary embodiment of the present disclosure is described above, the following modification examples may be added to this exemplary embodiment.

Figure 9:
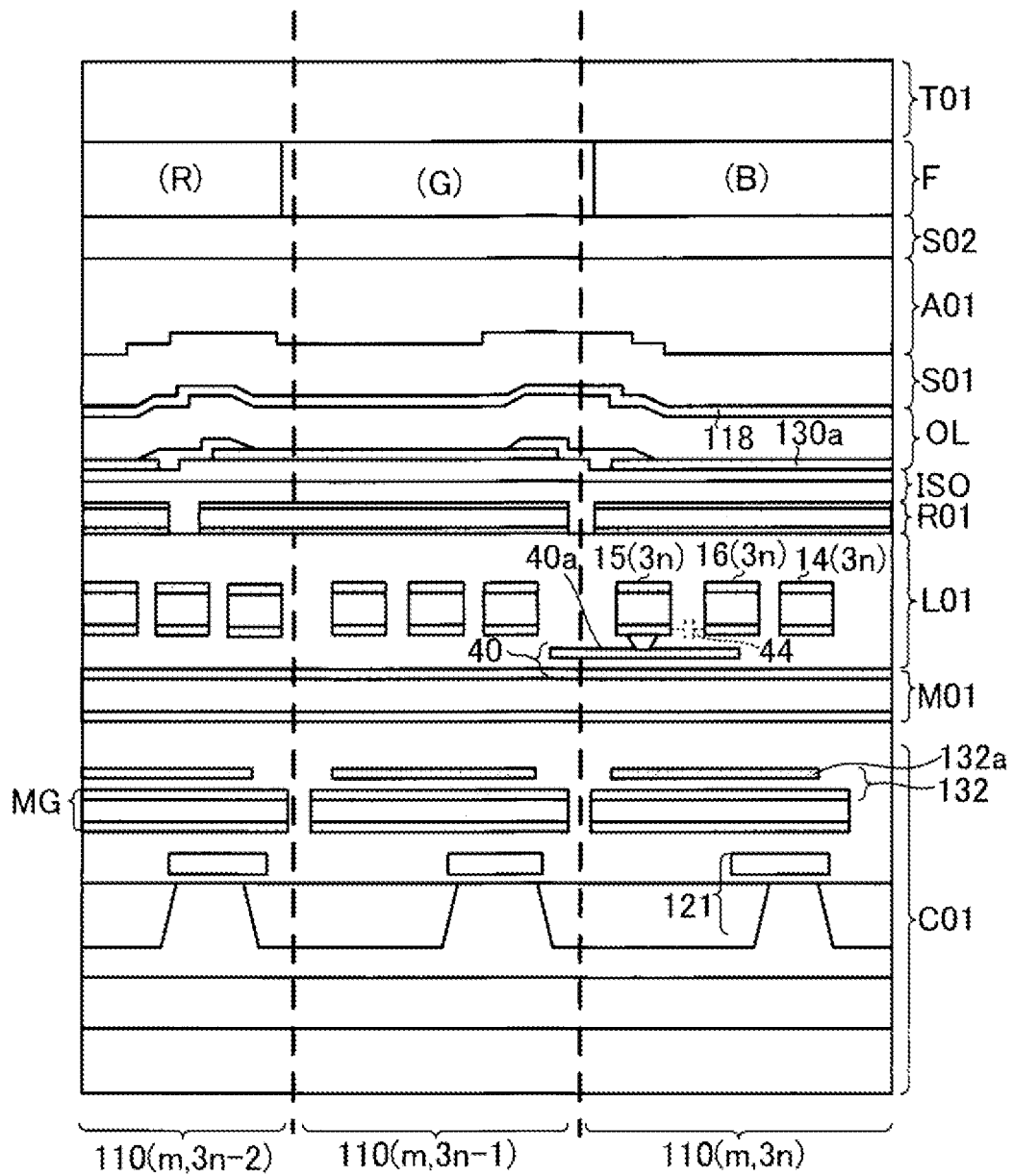
FIG. 9 is a view for explaining Modification Example (1).

(1) In the above exemplary embodiment, the second wiring layer L02 provided with the data line 14(3n) is separately provided from the first wiring layer L01 provided with the feed line 16(3n) and the first wiring 15(3n). However, as illustrated in FIG. 9, a second wiring layer L02 and a second metal layer M02 may be omitted, and a feed line 16(3n), a data line 14(3n), and first wiring 15(3n) may be provided in a first wiring layer L01.

Figure 10:
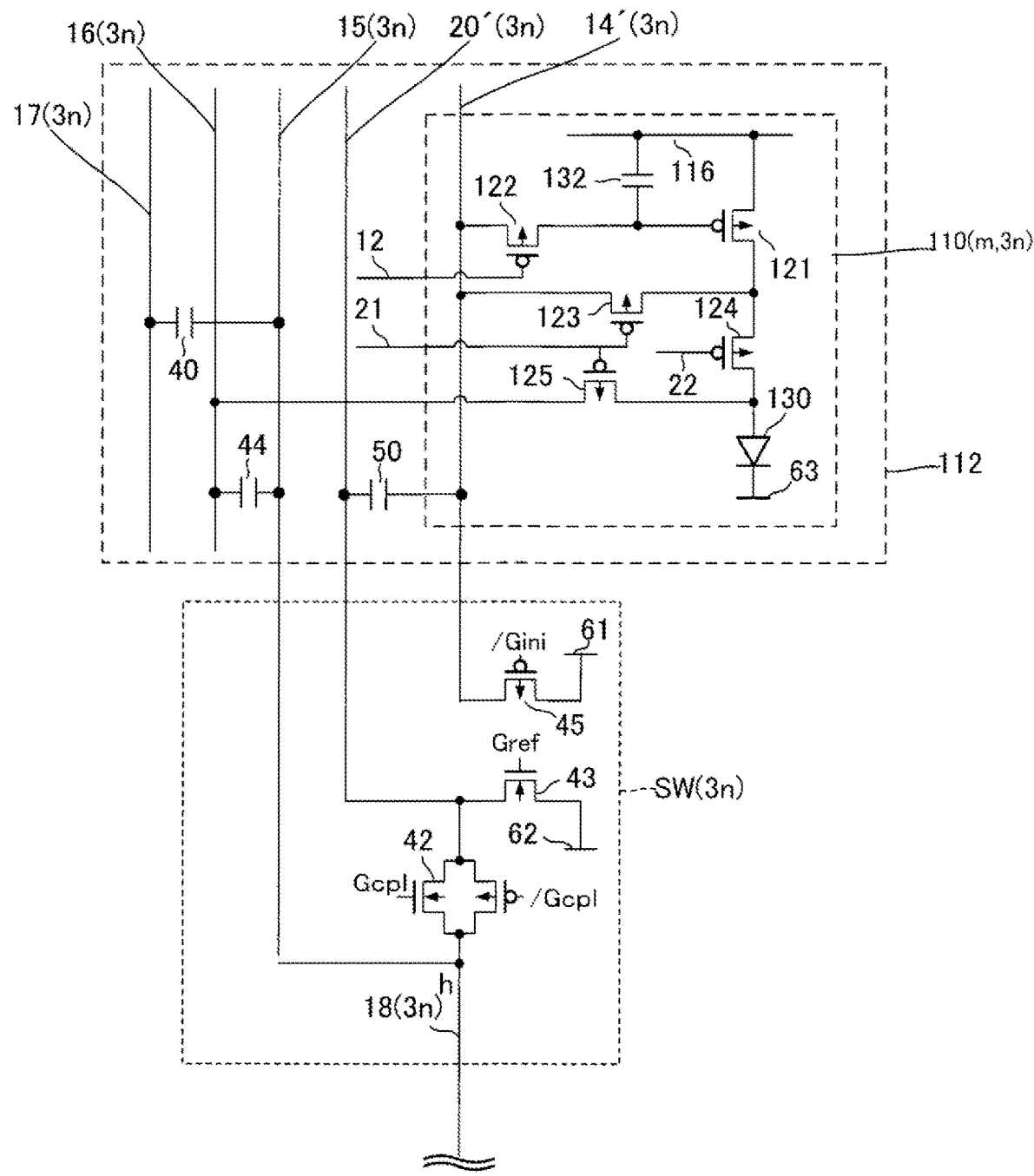
FIG. 10 is view for explaining Modification Example (2).
Figure 11:
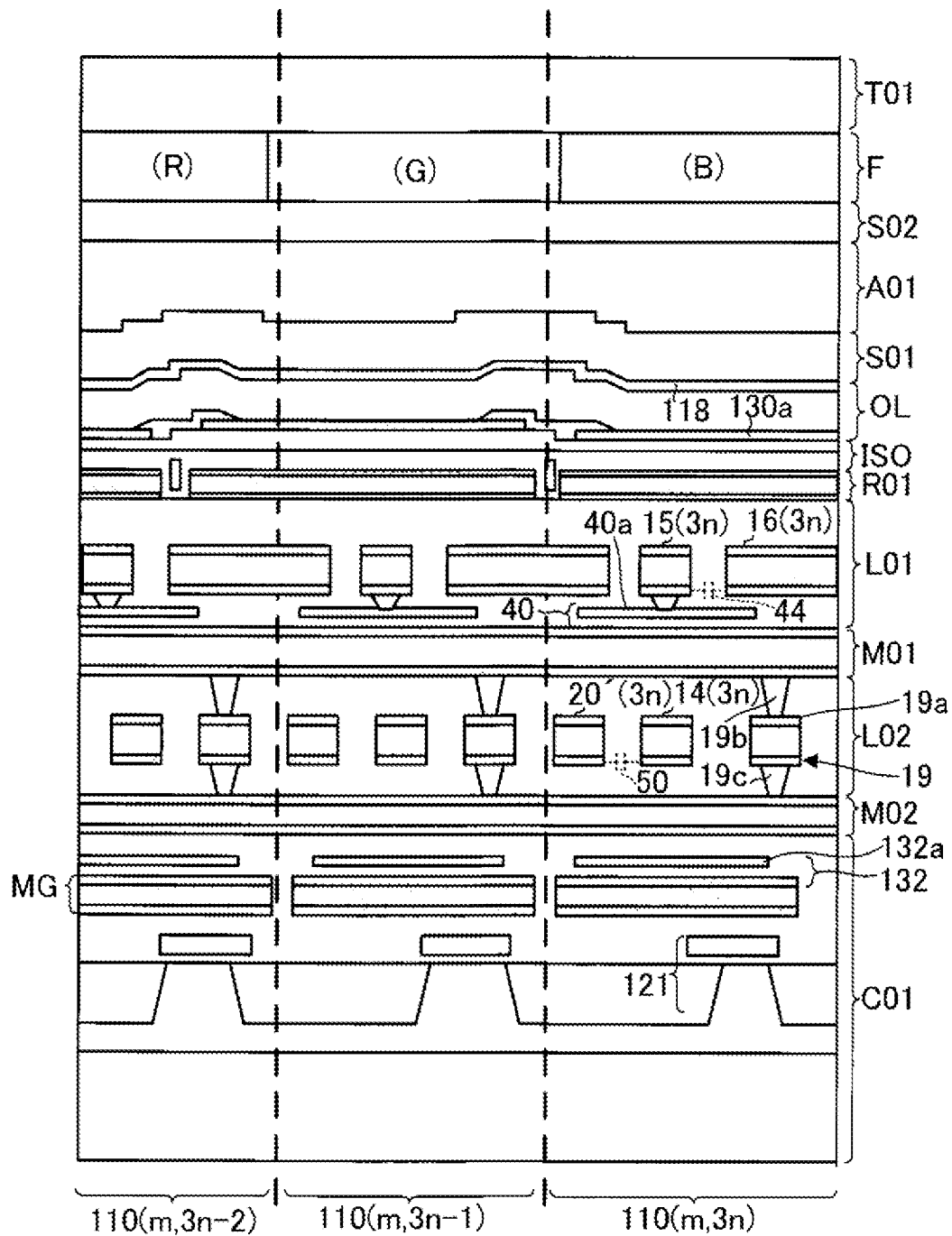
FIG. 11 is a view for explaining Modification Example (2).

(2) As illustrated in FIG. 10, the data line 14(3n) in FIG. 3 may be divided into a data line 14'(3n) to which a pixel circuit 110 and a transistor 45 are coupled, and second wiring 20'(3n) to which an output end of a transmission gate 42 and a transistor 43 are coupled, and a capacitor 50 (second capacitor) may be provided between the data line 14'(3n) and the second wiring 20'(3n). This enables the pixel circuit 110 to perform coupling drive by using the capacitor 50 as a transfer capacitor. Moreover, the second wiring 20'(3n) may be provided in the second wiring layer L02 to extend along the data line 14'(3n) (see FIG. 11), and an inter-wiring capacitor formed between the data line 14'(3n) and the second wiring 20'(3n) may serve as the capacitor 50. This enables the transfer capacitor used in the coupling drive to be provided in the display region 112 of a display unit 100, and enables the chip area of the portion other than the display region 112 to be reduced as compared to an aspect in which the transfer capacitor is provided in the portion other than the display region 112.

Figure 12:
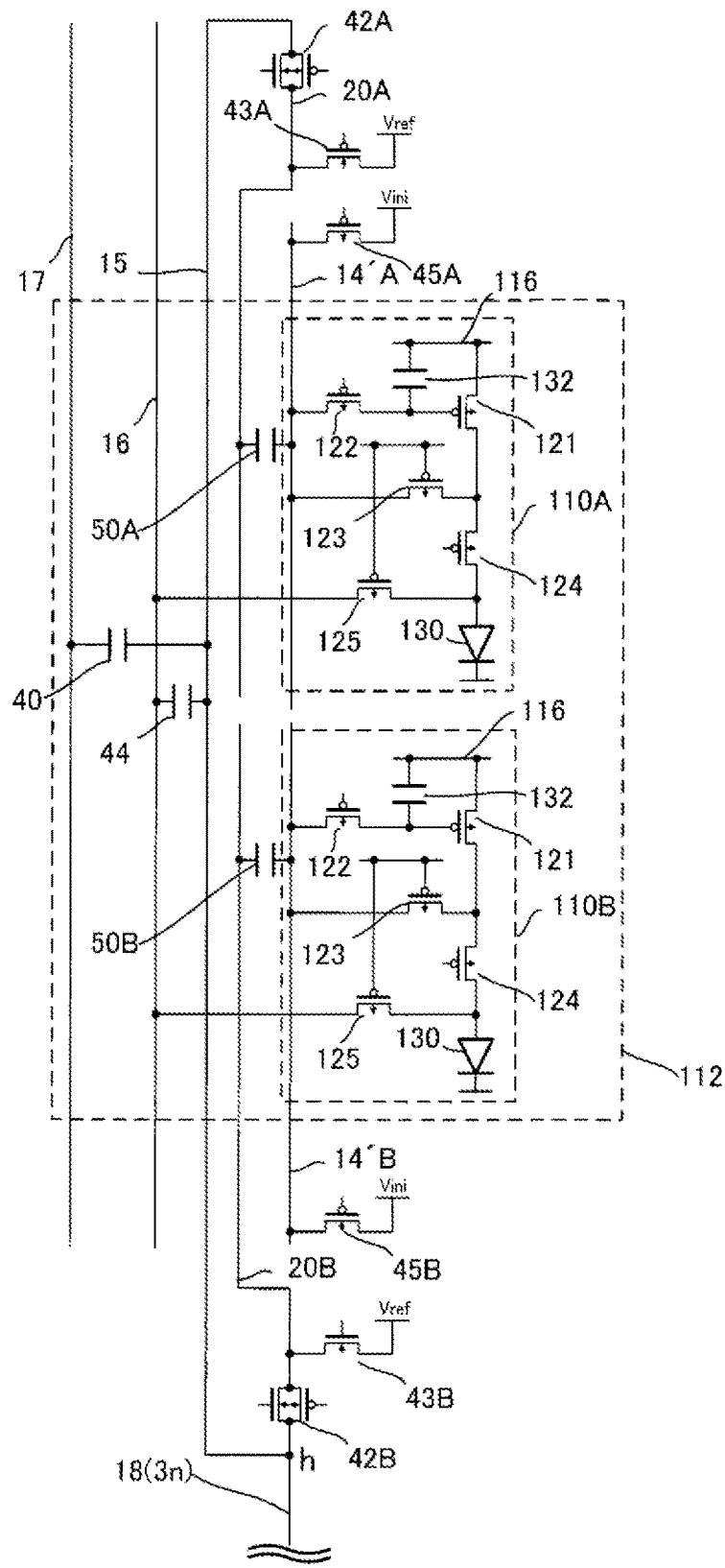
FIG. 12 is a view for explaining Modification Example (3).

(3) As illustrated in FIG. 12, a data line 14' in FIG. 10 may be divided vertically into two portions of a data line 14'A provided from a first row to row m, and a data line 14'B provided from row (m+1) to row M, and the second wiring 20' may be divided vertically into two portions of second wiring 20A coupled via a transmission gate 42A to the first wiring 15 and second wiring 20B coupled via a transmission gate 42B to the first wiring 15, as illustrated in FIG. 12. Note that a capacitor 50A in FIG. 12 serves as an inter-wiring capacitor formed between the data line 14'A and the second wiring 20A, and a capacitor 50B in FIG. 12 serves as an inter-wiring capacitor formed between the data line 14'B and the second wiring 20B. Moreover, a transistor 43A in FIG. 12 serves as a transistor configured to switch coupling and decoupling between a voltage generating circuit 31 being a reference power supply configured to supply a reference potential Vref and the second wiring 20A. A transistor 43B serves as a transistor configured to switch coupling and decoupling between the second wiring 20B and the above-described reference power supply. A transistor 45A in FIG. 12 is a transistor configured to switch coupling and decoupling between the voltage generating circuit 31 being an initialization power supply configured to supply an initialization potential Vini and the data line 14'A. A transistor 45B is a transistor configured to switch coupling and decoupling between the data line 14'B and the initialization power supply.

In the aspect illustrated in FIG. 12, the transmission gate 42A and the transmission gate 42B are switched on and off and thus, a pixel circuit 110A coupled to the data line 14'A and a pixel circuit 110B coupled to the data line 14'B can be driven independently and separately from each other. For example, while the transmission gate 42A is turned on to write a gradation voltage to the pixel circuit 110A, the transmission gate 42B can be turned off and the transistor 43B can be turned on to perform a compensation operation of a threshold voltage for a drive transistor of the pixel circuit 110B. Although a potential of the data line 14'B varies while the compensation operation for the drive transistor of the pixel circuit 110B is executed, the data line 14'A is decoupled from the data line 14'B and thus, no trouble occurs in the writing of the gradation voltage to the pixel circuit 110A. According to the aspect illustrated in FIG. 12, during the writing of the gradation voltage to one of the pixel circuit 110A and the pixel circuit 110B, the compensation operation for the other can be initiated, and a period for executing the compensation operation (compensation period) can be longer than in the related art. Generally, a compensating effect of the threshold voltage increases as the compensation period becomes longer, and thus, according to the aspect illustrated in FIG. 12, the compensation effect of the threshold voltage of the drive transistor provided in the pixel circuit can be enhanced. Further, according to the aspect illustrated in FIG. 12, a size of the portion other than the display region can be reduced.

C. Application Example

The light-emitting device according to the exemplary embodiment described above can be applied to various electronic apparatuses, and is particularly suitable for an electronic apparatus required to display a high-definition image of at least 2K by 2K and required to be compact. Hereinafter, an electronic apparatus according to the present disclosure will be described.

Figure 13:
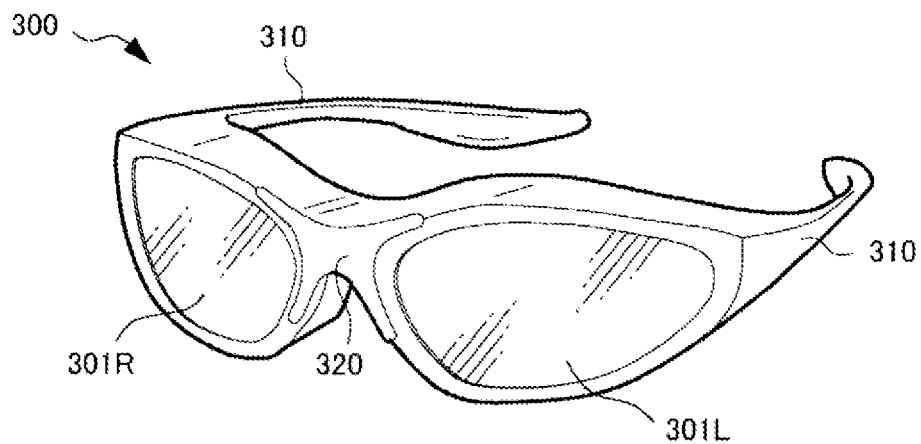
FIG. 13 is a perspective view illustrating a head-mounted display 300 according to the present disclosure.

FIG. 13 is a perspective view illustrating an outer appearance of a head-mounted display 300 as an electronic apparatus employing the light-emitting device of the present disclosure. As illustrated in FIG. 13, the head-mounted display 300 includes a temple 310, a bridge 320, a projection optical system 301L, and a projection optical system 301R. Then, in FIG. 13, a light-emitting device for a left eye (not illustrated) is provided behind the projection optical system 301L, and a light-emitting device for a right eye (not illustrated) is provided behind the projection optical system 301R.

Figure 14:
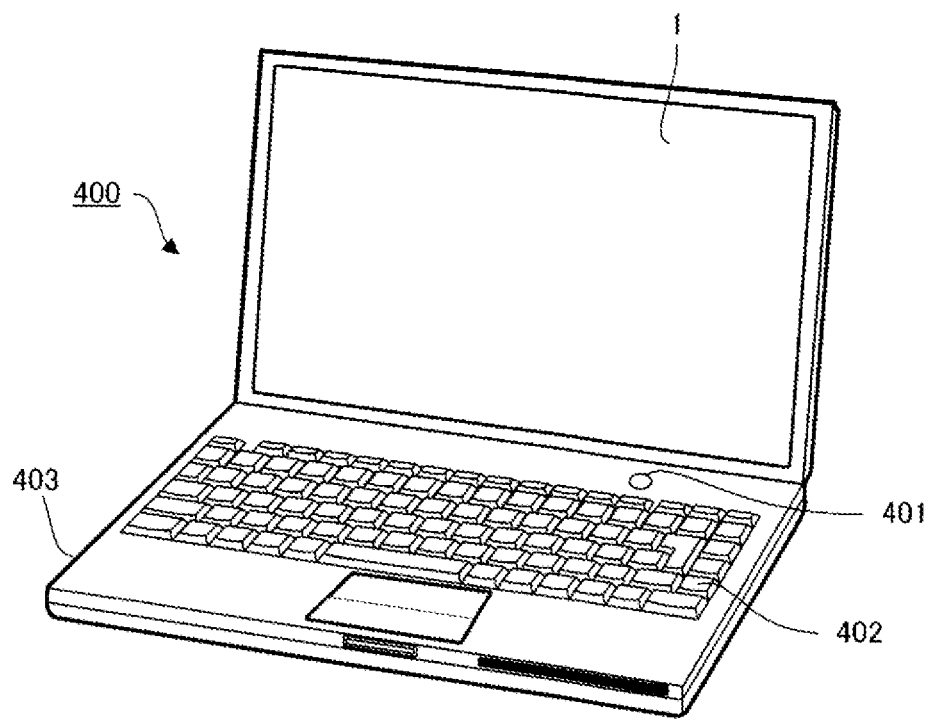
FIG. 14 is a perspective view illustrating a personal computer 400 according to the present disclosure.

FIG. 14 is a perspective view illustrating a personal computer 400 of a portable type employing the light-emitting device 1 according to the present disclosure. The personal computer 400 includes the light-emitting device 1 configured to display various images, and a main body portion 403 provided with a power switch 401 and a keyboard 402. Note that examples of the electronic apparatus to which the light-emitting device 1 according to the present disclosure is applied include, in addition to the apparatuses illustrated in FIG. 13 and FIG. 14, an electronic apparatus disposed close to eyes such as a digital scope, a digital binocular, a digital still camera, and a video camera. Further, the light-emitting device according to the present disclosure can be applied as a display unit provided in an electronic apparatus such as a mobile phone, a smartphone, a personal digital assistant (PDA), a car navigation device, and an automotive instrument panel.

What is claimed is:

1. A light-emitting device comprising:
a pixel circuit including a light-emitting element and a first transistor, the pixel circuit being disposed in a display region, the display region having a plurality of layers laminated in a lamination direction, the first transistor and the light-emitting element being disposed in different layers of the plurality of layers, the first transistor having a source or drain configured to be connected to the light-emitting element;
a data line corresponding to the pixel circuit, the data line extending in a direction perpendicular to the lamination direction;
a first wiring that is provided along the data line in the display region and that is electrically connected to the data line; and
a fixed potential line provided along the data line in the display region, the fixed potential line being disposed in a same layer as the first wiring in the lamination direction, wherein
a capacitor is configured between the first wiring and the fixed potential line and is disposed in the display region, and
in plan view, at least the first wiring or the fixed potential line overlaps with the first transistor, and the first wiring is located between the data line and the fixed potential line.

2. The light-emitting device according to claim 1, wherein in plan view, the first wiring and the fixed potential line overlap with the first transistor.

3. The light-emitting device according to claim 1, wherein the data line is disposed in a layer between the fixed potential line and the first transistor.

4. The light-emitting device according to claim 2, wherein the data line is disposed in a layer between the fixed potential line and the first transistor.

5. The light-emitting device according to claim 1, further comprising:
a switching element that controls electrical connection between the data line and the first wiring.

6. The light-emitting device according to claim 2, further comprising:
a switching element that controls electrical connection between the data line and the first wiring.

7. The light-emitting device according to claim 3, further comprising:
a switching element that controls electrical connection between the data line and the first wiring.

8. The light-emitting device according to claim 4, further comprising:
a switching element that controls electrical connection between the data line and the first wiring.

9. An electronic apparatus comprising the light-emitting device according to claim 1.

10. A light-emitting device comprising:
a pixel circuit including a light-emitting element and a first transistor, the pixel circuit being disposed in a display region, the display region having a plurality of layers laminated in a lamination direction, the first transistor and the light-emitting element being disposed in different layers of the plurality of layers, the first transistor having a source or drain configured to be connected to the light-emitting element;
a data line corresponding to the pixel circuit, the data line extending in a direction perpendicular to the lamination direction;
a first wiring that is provided along the data line in the display region and that is electrically connected to the data line;
a fixed potential line provided along the data line in the display region, the fixed potential line being disposed in a same layer as the first wiring in the lamination direction; and
an insulating film disposed so as to be sandwiched between the first wiring and the fixed potential line in plan view, wherein
in plan view, at least the first wiring, the fixed potential line, or the insulating film overlaps with the first transistor, and the first wiring is located between the data line and the fixed potential line.

11. The light-emitting device according to claim 10, wherein
in plan view, the first wiring, the fixed potential line, and the insulating film overlap with the first transistor.

12. The light-emitting device according to claim 10, further comprising:
a switching element that controls electrical connection between the data line and the first wiring.

13. The light-emitting device according to claim 11, further comprising:
a switching element that controls electrical connection between the data line and the first wiring.

14. A light-emitting device comprising:
a data line extending in a first direction;
a scanning line extending in a second direction that intersects with the first direction;
a pixel circuit being disposed in a display region corresponding to an intersection of the data line and the scanning line, the pixel circuit including:
a light-emitting element;
a first transistor supplying a current to the light-emitting element according to a data signal supplied via the data line; and
a second transistor electrically connecting a data line and a gate electrode of the first transistor according to a scanning signal supplied via the scanning line;
a first wiring being disposed in a first layer between the first transistor and the light-emitting element in the display region and electrically connected to the data line, the first wiring extending along the first direction; and
a fixed potential line being disposed in the first layer in the display region and next to the first wiring, the fixed potential line extending along the first direction, wherein
a capacitor is configured between the first wiring and the fixed potential line and is disposed in the display region, and
in plan view, the first wiring overlaps with the first transistor, and the first wiring is located between the data line and the fixed potential line.

15. An electronic apparatus comprising the light-emitting device according to claim 14.

* * * * *